US 11,094,689 B2

United States Patent
Tangring et al.

(10) Patent No.: US 11,094,689 B2
(45) Date of Patent: Aug. 17, 2021

(54) ELECTRONIC COMPONENT INCLUDING PROTECTIVE DIODE FOR ELECTROSTATIC DISCHARGE PROTECTION

(71) Applicant: OSRAM OLED GmbH, Regensburg (DE)

(72) Inventors: Ivar Tangring, Regensburg (DE); Thomas Schlereth, Pentling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/649,826

(22) PCT Filed: Sep. 20, 2018

(86) PCT No.: PCT/EP2018/075490
§ 371 (c)(1),
(2) Date: Mar. 23, 2020

(87) PCT Pub. No.: WO2019/057830
PCT Pub. Date: Mar. 28, 2019

(65) Prior Publication Data
US 2020/0286881 A1    Sep. 10, 2020

(30) Foreign Application Priority Data
Sep. 25, 2017   (DE) .................... 10 2017 122 111.5

(51) Int. Cl.
*H01L 27/02*  (2006.01)
*H01L 29/86*  (2006.01)
(Continued)

(52) U.S. Cl.
CPC ........ *H01L 27/0248* (2013.01); *H01L 25/167* (2013.01); *H01L 29/861* (2013.01)

(58) Field of Classification Search
CPC . H01L 27/0248; H01L 25/167; H01L 29/861; H01L 27/0255; H01L 25/16;
(Continued)

(56) References Cited

U.S. PATENT DOCUMENTS

2007/0246716 A1* 10/2007 Bhat ..................... H01L 27/15
257/81
2010/0109026 A1* 5/2010 Onushkin ............. H01L 27/156
257/88
(Continued)

FOREIGN PATENT DOCUMENTS

DE   10 2013 110 853 A1   4/2015
DE   10 2015 111 485 A1   1/2017
(Continued)

OTHER PUBLICATIONS

International Search Report issued for corresponding International Patent Application No. PCT/EP2018/075490 dated Dec. 17, 2018, along with an English translation, citing above references.
(Continued)

*Primary Examiner* — Didarul A Mazumder
(74) *Attorney, Agent, or Firm* — Hauptman Ham, LLP (57) ABSTRACT

An electronic component includes a first contact point for n-side contacting, a second contact point for p-side contacting, and a protective diode, which is connected antiparallel to the first contact point and to the second contact point. The protective diode includes a first diode structure which is p-conductive and a second diode structure which is n-conductive. The first diode structure is formed as a layer which overlaps in places with the first contact point in a first overlap region. The second diode structure is formed as a layer which overlaps in places with the second contact point
(Continued)

in a second overlap region. The first diode structure and the second diode structure overlap each other in a third overlap region.

15 Claims, 6 Drawing Sheets (51) Int. Cl.
*H01L 25/16* (2006.01)
*H01L 29/861* (2006.01)

(58) Field of Classification Search
CPC ....... H01L 23/62; H01L 27/02; H01L 29/866; H01L 29/872
USPC .............................................. 257/99; 438/22
See application file for complete search history.

(56) References Cited

U.S. PATENT DOCUMENTS

2010/0276779 A1* 11/2010 Guan ................. H01L 27/0259
257/492
2011/0089542 A1 4/2011 Shau
2011/0260210 A1* 10/2011 Su ........................... C23C 16/50
257/103

FOREIGN PATENT DOCUMENTS

| JP | 2011-165746 A | 8/2011 |
| WO | 2008/120947 A1 | 10/2008 |
| WO | 2009/079983 A1 | 7/2009 |
| WO | 2015/074900 A1 | 5/2015 |
| WO | 2017/009085 A1 | 1/2017 |
| WO | 2017/009292 A1 | 1/2017 |

OTHER PUBLICATIONS

Written Opinion issued for corresponding International Patent Application No. PCT/EP2018/075490 dated Dec. 17, 2018.
Search Report issued for corresponding German Patent Application No. 102017122111.5 dated Mar. 20, 2018.

* cited by examiner

ELECTRONIC COMPONENT INCLUDING PROTECTIVE DIODE FOR ELECTROSTATIC DISCHARGE PROTECTION

CROSS REFERENCE TO RELATED APPLICATION

This application is a National Stage of International Application No. PCT/EP2018/075490, filed on Sep. 20,2018, which designates the United States and was published in Europe, and which claims priority to German Patent Application DE 10 2017 122 111.5, filed on Sep. 25, 2017, in the German Patent Office. Both of the aforementioned applications are hereby incorporated by reference in their entireties.

An electronic component is specified.

An object of the invention is to specify a component that can be made particularly compact.

The electronic component can be a semiconductor chip, for example. Furthermore, the electronic component can be a component with one or more semiconductor chips. In particular, the electronic component may also be an optoelectronic component comprising at least one optoelectronic semiconductor chip or consisting of at least one optoelectronic semiconductor chip. For example, the at least one optoelectronic semiconductor chip may be a radiation-emitting semiconductor chip such as a light-emitting diode chip and/or a laser diode chip. In addition, the at least one optoelectronic semiconductor chip can be a radiation-receiving chip such as a photodiode chip.

According to at least one embodiment of the electronic component, the electronic component comprises a first contact point for n-side contacting and a second contact point for A-side contacting. The electronic component can be operated by contacting the first contact point and the second contact point. It is possible that the first contact point and the second contact point are intended for direct contact from outside. Alternatively, it is possible that the electronic component is contacted via connection points that are electrically connected to the contact points.

The first contact point and the second contact point are formed with an electrically conductive material, in particular with a metallic material. For example, the first contact point and the second contact point include at least one of the following metals: copper, gold, platinum, nickel.

The first contact point and the second contact point are arranged on an outer side of the electronic component and are accessible there, at least in places, for electrically conductive connection. For example, the first contact point and the second contact point are each embodied as a layer with a uniform thickness within the manufacturing tolerance. For example, the thickness of the first contact point and the second contact point, measured in a direction perpendicular to the principal plane of extension of the contact points, is at least 2 µm or at least 10 µm, in particular at least 60 µm.

According to at least one embodiment of the electronic component, the electronic component comprises a protective diode which is connected antiparallel to the first contact point and to the second contact point. The protective diode is a diode that is configured to protect the component against electrostatic discharge (ESD). The protective diode can be a real diode, for example, which has a high breakdown voltage of, for example, greater than 50 V, in particular greater than 100 V. In addition, the protective diode may be a Zener diode that has a Zener voltage that is 10 V, 20 V, 40 V or more, for example. Advantageously, the Zener voltage can be adjusted with particular accuracy.

The protective diode is connected antiparallel to the first contact point and the second contact point. This means that the protective diode is configured to provide ESD protection for the electronic component.

According to at least one embodiment, the protective diode comprises a first diode structure which is p-conductive and a second diode structure which is n-conductive. This means, for example, that the diode structures of the protective diode are formed with a base material which is doped accordingly to form a first, p-conductive diode structure and a second, n-conductive diode structure.

According to at least one embodiment of the electronic component, the first diode structure is configured as a layer that overlaps in places with the first contact point in a first overlap region. The fact that the first diode structure is formed as a layer means, for example, that the diode structure has a thickness, for example transverse or perpendicular to its main plane of extension, which is small compared to its extension in lateral directions, for example parallel to the main plane of extension of the diode structure. The first diode structure overlaps with the first contact point. For example, the first diode structure is directly or indirectly electrically conductively connected to the first contact point. It covers the first contact point in the first overlap region in places or completely.

According to at least one embodiment, the second diode structure is configured as a layer that overlaps in places with the second contact point in a second overlap region. The fact that the second diode structure is formed as a layer means, for example, that the diode structure has a thickness, for example transverse or perpendicular to its main plane of extension, which is small compared to its extension in lateral directions, for example parallel to the main plane of extension of the diode structure. The second diode structure overlaps with the second contact point. For example, the second diode structure is directly or indirectly electrically conductively connected to the second contact point. It covers the second contact point in the second overlap region in places or completely.

According to at least one embodiment of the electronic component, the electronic component includes a third overlap region in which the first diode structure and the second diode structure overlap each other. For example, it is possible that the first diode structure and the second diode structure are directly or indirectly electrically conductively connected to each other in the third overlap region and overlap in places. In this way, for example, a pn junction can form at the interface between the first diode structure and the second diode structure in the overlap region, which determines the diode properties of the protective diode.

According to at least one embodiment, an electronic component is specified with
  a first contact point for n-side contacting,
  a second contact point for p-side contacting, and
  a protective diode which is connected antiparallel to the first contact point and to the second contact point, wherein
  the protective diode comprises a first diode structure which is p-conductive,
  the protective diode comprises a second diode structure which is n-conductive,
  the first diode structure is formed as a layer that overlaps in places with the first contact point in a first overlap region, the second diode structure is formed as a layer which overlaps in places with the second contact point in a second overlap region, and the first diode structure and the second diode structure overlap in a third overlap region.

The electronic component described herein is based on the following considerations, among others: It is possible to form an ESD protection for an electronic component such as a semiconductor chip or a component such as a high-power light-emitting diode by means of a dedicated ESD chip which is connected antiparallel to the electronic component. However, such an ESD chip has to be connected to the component in a complex electrically conductive manner and takes up a lot of space. In addition, such an ESD chip is often radiation-absorbing, which can lead to problems when used in optoelectronic components. Especially in the case of components formed by so-called chip size packages (CSP) in which the size, especially the volume, of the component is determined by the size of the semiconductor chip installed therein, there is often no space for an ESD chip, so that it has to be additionally applied to a printed circuit board, for example.

A protective diode, which is configured as a layer that overlaps with contact points of the electronic component, can be configured to be particularly space-saving. As a result, the volume of the component hardly increases due to the protective diode. In addition, the manufacturing of such a protective diode can be carried out directly on the other components of the electronic component, so that the other manufacturing processes used to manufacture the electronic component do not need to be modified. Furthermore, the protective diode is connected to the contact points of the component, particularly on an outer side of the component, so that—unlike when the protective diode is integrated into the interior of the component—for example no active surface of the semiconductor chip of the component needs to be used to form the protective diode.

According to at least one embodiment of the electronic component, the first diode structure has a thickness of 1 μm or less and the second diode structure has a thickness of 1 μm or less. This means that, overall, the protective diode has a thickness, measured for example perpendicularly to a main plane of extension of the protective diode, which does not exceed 2 μm, in particular not more than 1 μm. This means that even in comparison to the contact points, which can have a thickness of about 60 μm, for example, the protective diode is extremely thin, so that it does not noticeably increase the volume of the electronic component.

According to at least one embodiment of the electronic component, the first diode structure and the second diode structure each have the same base material, the base material being polycrystalline or amorphous. Surprisingly, it turned out that a particularly thin protective diode can be formed in particular with a non-crystalline material. This means that a protective diode in which the diode structures are formed by the same base material, which is polycrystalline or amorphous, can be made particularly thin. The first diode structure and the second diode structure differ from each other by the doping of the base material. Furthermore, such a base material can be permeable to electromagnetic radiation, especially light. In this way, interfering absorptions, which can particularly reduce the efficiency of an optoelectronic component, are avoided.

According to at least one embodiment of the electronic component, the first diode structure and/or the second diode structure is produced by sputtering. This means, for example, that the base material is applied directly to the outer surface of the electronic component by sputtering at the target location. The base material can be doped during or after application. The fact that the base material is applied by sputtering can be verified by analysis methods commonly used in semiconductor technology, for example by electron tunneling microscopy, using the crystal structure of the applied diode structure. Therefore, the feature that at least one of the diode structures is sputtered is an objective feature that is detectable on the finished product.

According to at least one embodiment of the electronic component, the first diode structure and/or the second diode structure is produced by vapor deposition and subsequent tempering. This manufacturing method can also be verified by analysis methods of semiconductor technology, so that this is also an objective characteristic that is detectable on the finished product. In particular, it is possible that the two diode structures are manufactured by different manufacturing processes. For example, the first diode structure can be sputtered and the second diode structure can be manufactured by vapor deposition and tempering. Furthermore, the manufacturing processes can also be varied during the manufacturing of a diode structure.

The manufacture of a diode structure by sputtering is carried out in particular at a temperature of at least 250° C., in particular at least 300° C., in order to achieve the desired, for example, polycrystalline structure and to activate the dopants in the base material. If this temperature is too high for the other components of the electronic component—for example, if the component comprises an organic or a polymer material—the diode structure can be manufactured in particular by vapor deposition and subsequent tempering. Tempering can be carried out, for example, by means of locally and temporally limited laser pulses, whereby local temperatures of 150° C. at most occur.

In particular, the protective diode in the present case is not a separately manufactured component, but the protective diode is generated in the electronic component on its outer surface. For example, the protective diode is generated at the first contact point and the second contact point. It is therefore not necessary to provide a specially prepared connection point for the protective diode, which is planarized, for example. Instead, the protective diode can follow the course of the surface on which it is applied. Due to the small thickness of the protective diode, further processing of the electronic component by the protective diode is also not restricted. The protective diode can thus be integrated into the component in particular. Therefore the protective diode cannot be removed from the component without being destroyed. This means that when the protective diode is removed from the component, at least the protective diode is destroyed. This ensures a particularly secure hold of the protective diode in the component.

According to at least one embodiment of the electronic component the first diode structure and the second diode structure are each formed by the same base material, the base material comprising at least one of the following materials: silicon, ZnO, ITO, IZO. These materials have proved to be particularly suitable for forming a thin diode structure and thus for forming a thin protective diode. Furthermore, these materials are at least partially permeable in the range of visible light, making them particularly suitable for use in an optoelectronic component.

According to at least one embodiment of the electronic component, the component comprises an optoelectronic semiconductor chip configured to generate or receive electromagnetic radiation, the protective diode being permeable to the electromagnetic radiation. For example, the semiconductor chip is a light-emitting diode chip. The protective diode may be permeable to the electromagnetic radiation, especially visible light. This means that little or none of the generated or to be received electromagnetic radiation is absorbed by the protective diode. The component described herein can therefore be operated particularly efficiently.

According to at least one embodiment of the electronic component, the first contact point and the first diode structure are in direct contact with each other in the first overlap region, the second contact point and the second diode structure are in direct contact with each other in the second overlap region, and the first diode structure and the second diode structure are in direct contact with each other in the third overlap region. In other words, in this case the protective diode is applied directly to the first contact point and the second contact point. Furthermore, no other material is placed between the two diode structures. In this way, a particularly thin protective diode can be created directly on the outer surface of the component.

According to at least one embodiment of the electronic component, at least one of the overlap regions has an area of at least 100 µm2. In particular, each of the overlap regions has an area of at least 100 µm2. For example, the overlap region is between at least 100 µm2 and at most 1000 µm2. Such large overlap regions between the diode structures and the contact points or the diode structures among themselves make it possible to form a protective diode which has a high breakdown voltage and which is in good ohmic contact with the contact points.

According to at least one embodiment of the electronic component, the electronic component comprises a first connection point in direct contact with the first contact point and the first diode structure, the first diode structure being interposed between the first connection point and the first contact point. Via such a connection point it is possible to contact the electronic component from outside. For example, the connection point can be set up to be contacted via soldering at the component's destination.

According to at least one embodiment of the electronic component, the first connection point is galvanically generated on the first contact point and the first diode structure. This means that the first diode structure is integrated between the first contact point and the first connection point, for example in a connection pin of the electronic component. The first diode structure can, for example, be galvanically overgrown with material from the first connection point.

According to at least one embodiment of the electronic component, the electronic component comprises a second connection point in direct contact with the second contact point and the second diode structure, the second diode structure being interposed between the second connection point and the second contact point. In the same way as the first connection point, the second connection point can also be galvanically generated on the second contact point and the second diode structure.

According to at least one embodiment of the electronic component, the electronic component comprises a base body comprising at least one of the following materials or elements: metal, semiconductor, plastic, ceramic, semiconductor chip. The contact points of the electronic component are arranged on an outer surface of the base body. In the same way, the diode structures are arranged on the outer surface of the base body and can be in direct contact with the base body there, for example.

For example, the base body may be a semiconductor chip with both contact points on one side. Such a semiconductor chip can be a flip chip, for example. The protective diode is then electrically conductively connected to the contact points of the semiconductor chip and is in direct contact with the material of the semiconductor chip in places. In addition, it is also possible that the base body is the base body of a housing for at least one semiconductor chip or the base body of a connection carrier, for example a printed circuit board for at least one semiconductor chip. In this case, the base body may be formed by a metal, semiconductor material, plastic, ceramic or other suitable material.

In the following, the electronic component described herein will be explained in more detail using exemplary embodiments and the corresponding figures.

In the exemplary embodiments and figures, identical, similar or equivalent elements can each be provided with the same reference signs. The elements shown and their proportions are not to be regarded as true to scale. Rather, individual elements may be displayed in an exaggeratedly large format for better representability and/or better understanding.

Figure 1A:
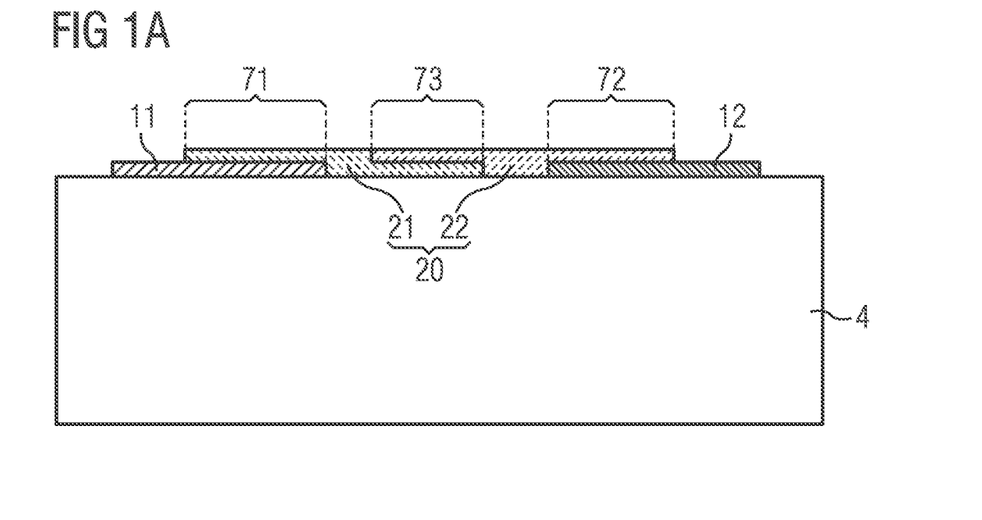
FIGS. 1A, 1B, 2A, 2B, 3A, 3B, 4A, 4B, 5A, 5B, 6A, 6B show exemplary embodiments of electronic components described herein using schematic diagrams.

FIG. 1A shows a schematic sectional view of a first exemplary embodiment of an electronic component described herein. The electronic component is an optoelectronic semiconductor chip, for example a light-emitting diode chip. The electronic component comprises a base body 4, which is formed, for example, by a semiconductor material and forms the semiconductor body of an optoelectronic semiconductor chip. On the upper side of the base body 4 the first contact points 11 and the second contact points 12 are arranged, which are formed by metallization, for example. The first diode structure 21 is applied to the first contact point and the base body 4. The second diode structure 22 is applied to the first diode structure 21, the base body 4 and the second contact point 12.

In a first overlap region 71 the first diode structure 21 overlaps with the first contact point 11. In a second overlap region 72 the second diode structure 22 overlaps with the second contact point 12. In the third overlap region 73 the first diode structure 21 and the second diode structure 22 overlap.

The overlap regions 71, 72, 73 each have a surface area of at least 100 µm2.

The diode structures 21, 22 together form the protective diode 20. The diode structures 21, 22 each have a thickness of at most 1 µm, measured in a direction perpendicular to the cover surface of the base body 4. The diode structures 21, 22 are, for example, each formed with an amorphous base material such as amorphous silicon or with a polycrystalline base material such as polycrystalline silicon.

The first contact point 11 is a contact point for n-side contacting, which is electrically conductively connected to the p-conducting first diode structure 21. The second contact point 12 is a contact point for p-side contacting, which is electrically connected to the n-conducting second diode structure 22. In this way the protective diode 20 is connected antiparallel to the two contact points.

In the overlap regions 71, 72, 73, the diode structures 21, 22 are in direct contact with the respective contact points 11, 12 and with each other. In addition, both diode structures 21, 22 are in direct contact with the base body 4. Overall, the electronic component according to the exemplary embodiment in FIG. 1A is, for example, a flip chip with the protective diode 20 connected antiparallel to its contact points. For example, the first contact point 11 and the second contact point 12 have a thickness between 2 and 10 µm in the exemplary embodiment of FIG. 1A.

The diode structures 21, 22 are, for example, applied via a photomask in each case. For example, the first contact point 11 is first exposed via the photomask for n-side contacting. The first contact point 11 is formed with gold and/or nickel, for example. The first diode structure 21 is then deposited, for example, by sputtering. The first diode structure 21 is then a p-doped polycrystalline semiconductor such as silicon.

Afterwards the photomask is removed and a second photomask is applied to expose, in the same way, the second contact point 12 and the second diode structure 22, which can be n-doped polycrystalline silicon.

The second photomask is then removed and the electronic component can be further processed. Optionally, it is possible to apply a non-wetting coating to the outer surface of the protective diode 20, which has non-wetting properties for a solder material, for example. This layer can be formed, for example, with a polytetrafluoroethylene such as Teflon.

Figure 1B:
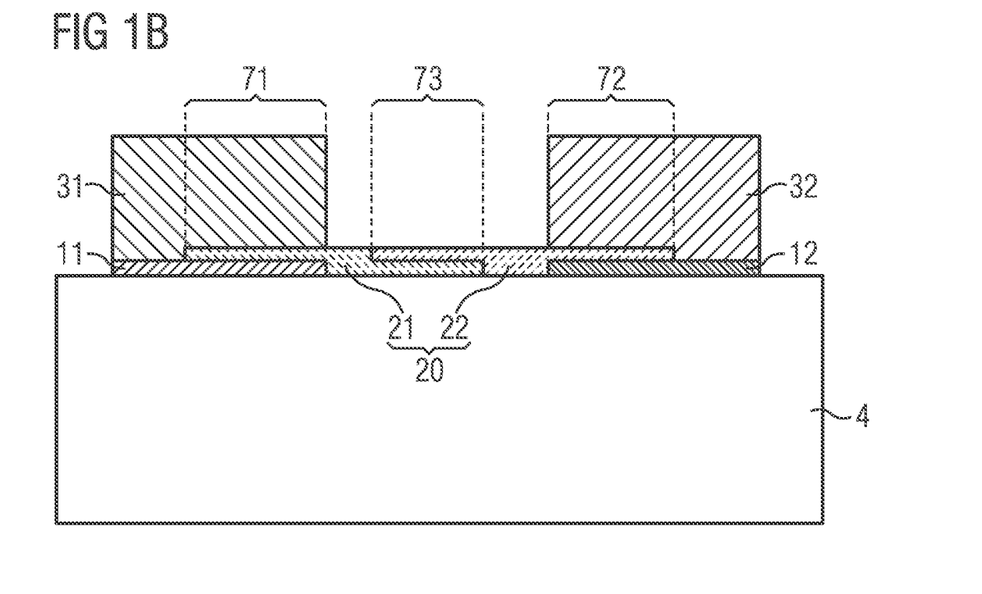

In connection with FIG. 1B, another exemplary embodiment of an electronic component described herein is explained in more detail. In this exemplary embodiment, a first connection point 31 is galvanically applied to the first contact point 11, so that the first diode structure 21 is located between the first contact point 11 and the first connection point 31 and is in direct contact with both. In the same way, a second connection point 32 can be applied to the second contact point 12. In this way thick connection points can be processed.

Figure 2A:
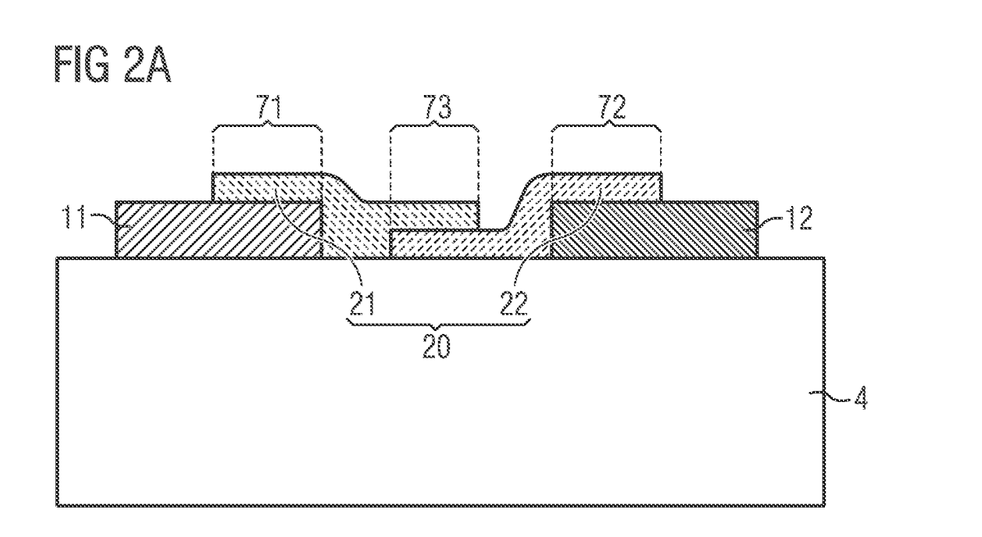
Figure 2B:
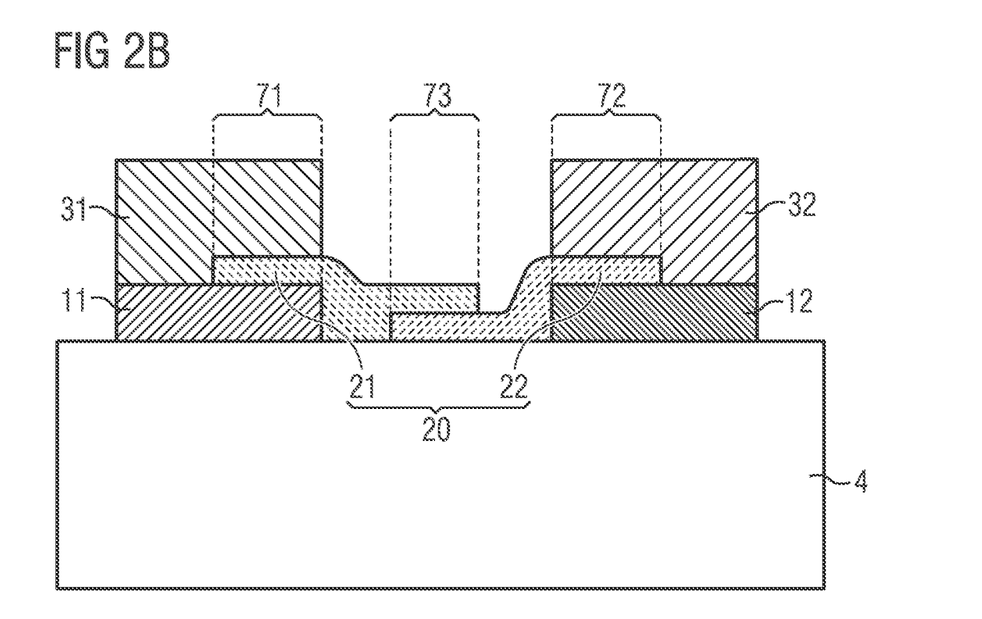

In connection with FIGS. 2A and 2B, electronic components corresponding to the exemplary embodiments of FIGS. 1A and 1B are described in which the first contact point 11 and the second contact point 12 are already thicker and have a thickness of 50 µm or more, for example. In this case it is possible that the protective diode 20 is thicker than 1 µm in the area between the contact points 11 and 12. In particular, however, the protective diode 20 in the area between contact points 11, 12 does not protrude above the two contact points in either of the two exemplary embodiments.

Figure 3A:
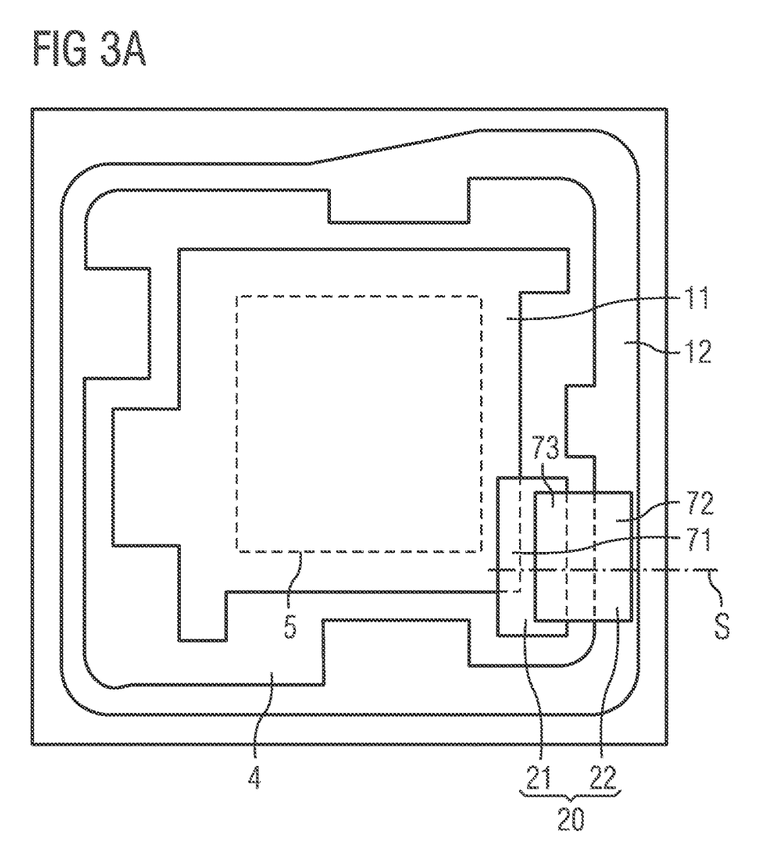
Figure 3B:
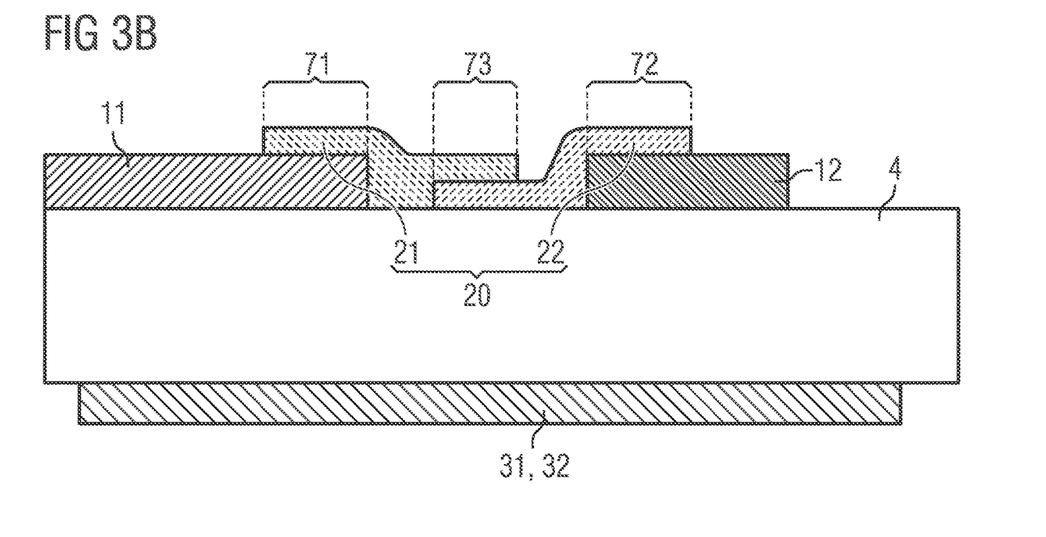

In conjunction with FIGS. 3A and 3B, a further example of an electronic component described herein is explained in more detail using schematic diagrams. FIG. 3B shows a sectional view along and parallel to section line S. In this exemplary embodiment, the electronic component is a semiconductor chip 5, which is arranged on a ceramic carrier. This means that the base body 4, for example, is formed with a ceramic material. The first contact point 11 and the second contact point 12 are located on the upper side of the base body 4. The two contact points 11, 12 are connected to the respective diode structures 21, 22, which together form the protective diode 20, whereby the protective diode 20 is connected antiparallel in contact points 11, 12. The semiconductor chip 5 can be a flip chip, for example, or it is connected on the n-side to the first contact point 11 and connected to the second contact point 12 via a bonding wire. The protective diode 20 is then connected antiparallel to chip 5. The electronic component can, for example, be contacted from outside via contact points 11, 12 and/or via connection points 31, 32 on the underside of the base body 4.

If the base body 4 is formed with a ceramic material as in this exemplary embodiment, the diode structures 21, 22 can be applied by sputtering at a temperature of about 300° C.

In the exemplary embodiment of FIGS. 3A and 3B, the diode structure is attached to the upper side of the base body 4, to which the semiconductor chip 5 is also attached.

Figure 4A:
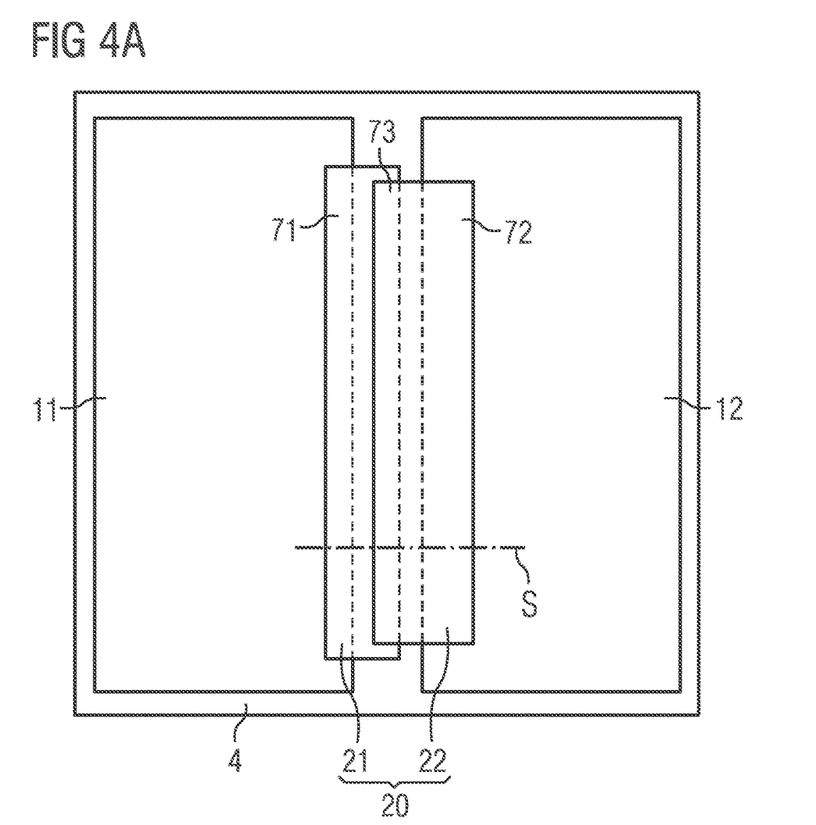
Figure 4B:
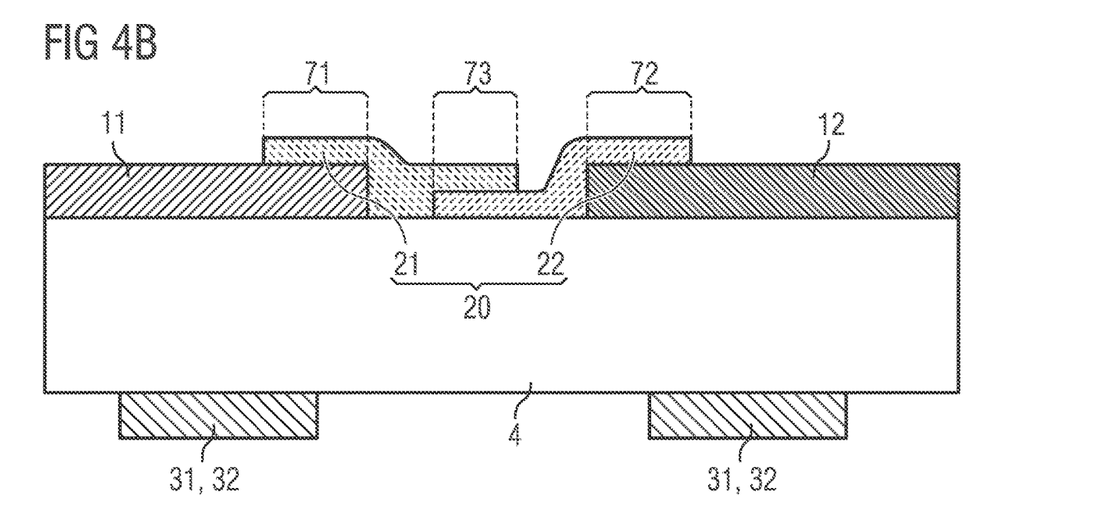

In contrast, the schematic diagrams of FIGS. 4A and 4B show an exemplary embodiment in which the protective diodes 20 on the underside of the base body 4 are connected antiparallel between the contact points 11, 12. This is possible with a protective diode described herein because, due to the layer structure, it can be made so thin that contacting and mounting on the underside is not hindered by the protective diode 20.

On the upper side facing away from the underside, for example, first and second connection points 31, 32 can be formed, which serve, for example, for contacting at least one semiconductor chip. Also in the exemplary embodiment of FIGS. 4A and 4B, the material of the base body 4, for example, is a temperature-stable material like a ceramic material, so that the protective diode 20 can be formed by sputtering on the diode structures 21, 22. FIG. 4B shows a sectional view along and parallel to the section line S.

Figure 5A:
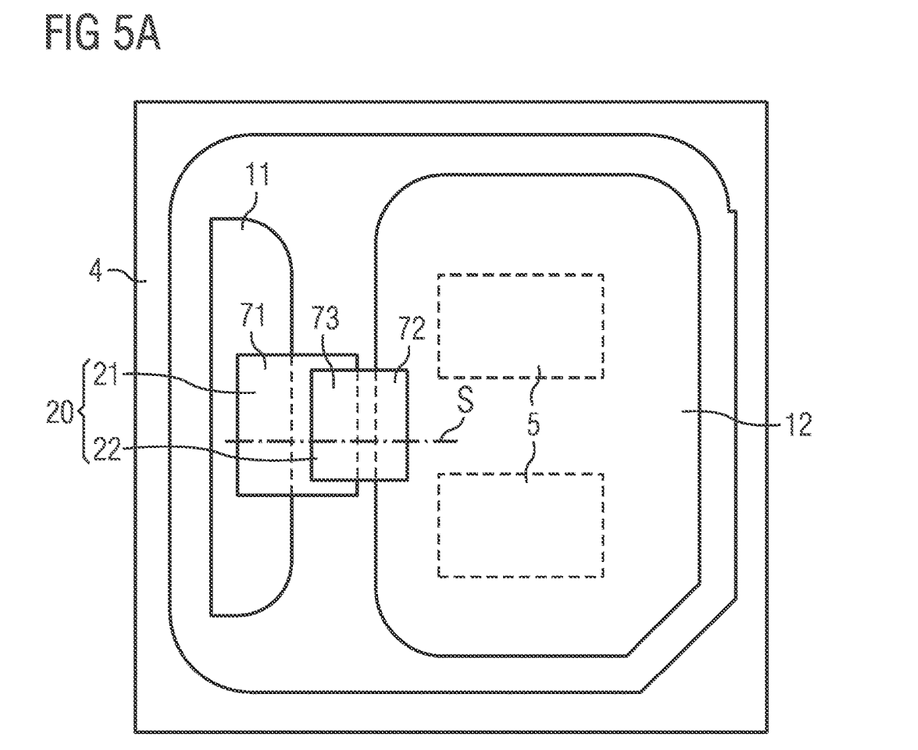
Figure 5B:
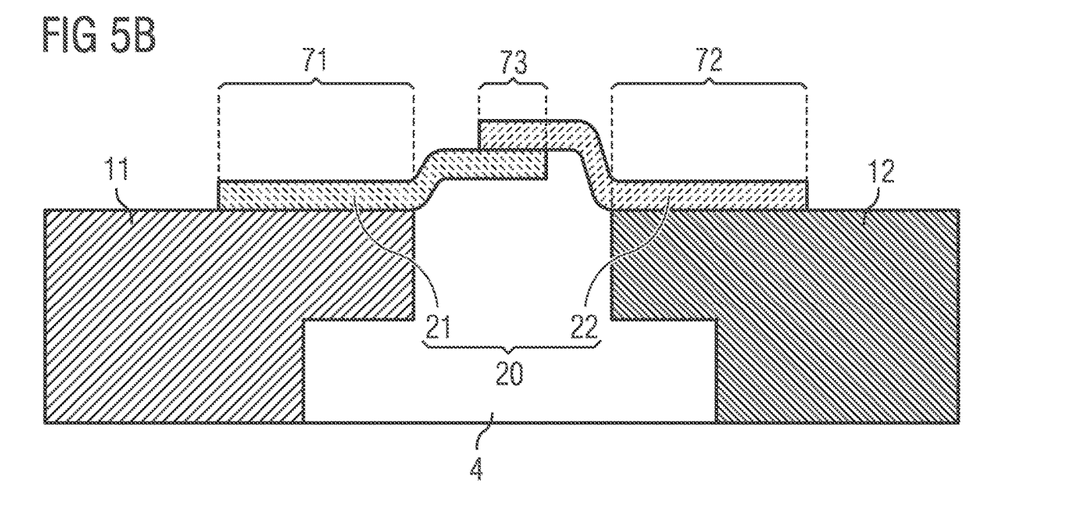

In conjunction with the schematic diagrams in FIGS. 5A and 5B, another exemplary embodiment of an electronic component described herein is explained in more detail, in which the base body 4 can be formed by a temperature-sensitive material, such as a plastic, for example. In this case the protective diode 20, i.e. the first diode structure 21 and the second diode structure 22, is not formed by sputtering, but by vapor deposition and subsequent tempering, for example by means of laser radiation. FIG. 5B shows a sectional view along and parallel to the section line S.

The diode structures 21, 22 run in places in direct contact with the base body 4, which is formed with a plastic material, for example. It is possible that the base body 4 between the contact points 11, 12 has a raised area compared to the contact points 11, 12, over which the diode structures 21, 22 run. Since the diode structures 21, 22 are produced by vapor deposition, they can follow the course of the base body 4, so that, for example, no planarized surface needs to be provided on which the protective diode 20 is applied, as would be the case, for example, for an ESD chip that is manufactured separately.

Figure 6A:
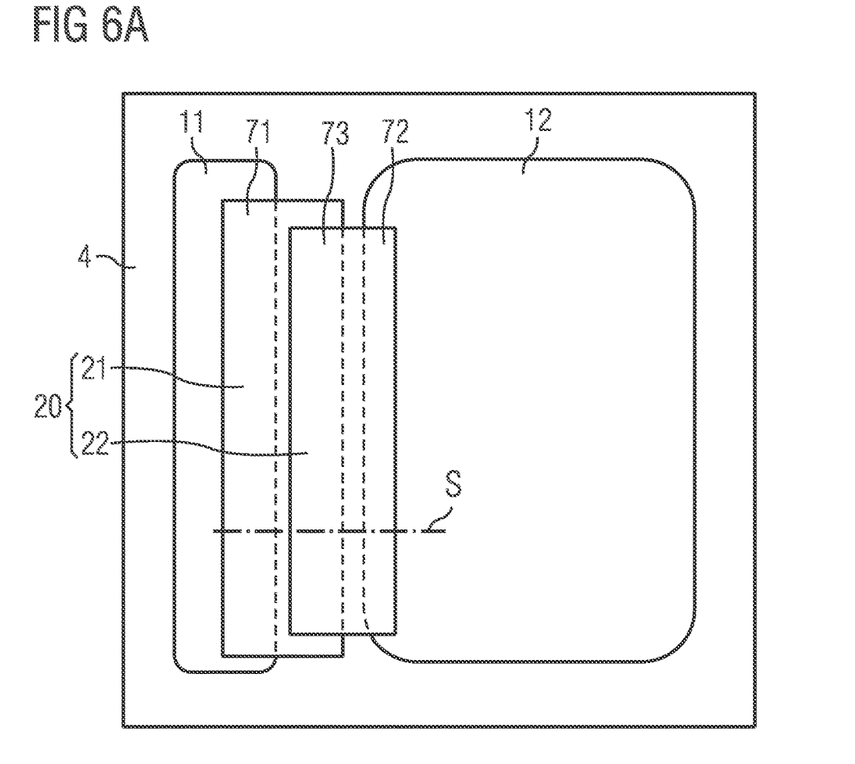
Figure 6B:
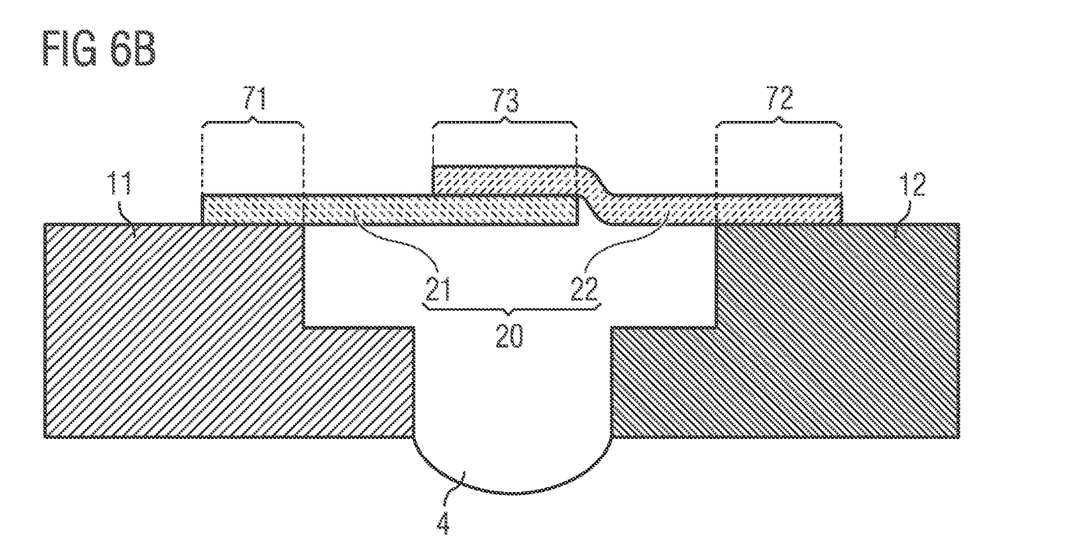

In the exemplary embodiment of FIGS. 5A, 5B the protective diode 20 is applied to an upper side of the component. In the same way, the protective diode 20 can be applied to the underside of the component. This is explained, for example, in connection with the exemplary embodiment of FIGS. 6A and 6B. FIG. 6B shows a sectional view along and parallel to the section line S.

Furthermore, it is possible that a semiconductor chip described in connection with FIGS. 1A, 1B, 2A, 2B is used as an electronic component in an electronic component as described in connection with FIG. 3A, 3B, 4A, 4B, 5A, 5B, 6A or 6B. This means that the electronic component may also include, for example, two of the described protective diodes, one on the semiconductor chip and one on the housing of the electronic component.

In addition, many other variants of electronic components are conceivable in which a protective diode described herein can be used. This means that the protective diode described herein can also be used in a particularly flexible manner.

The invention is not limited by the description of the exemplary embodiments. Rather, the invention includes any new feature and any combination of features, which in particular includes any combination of features in the patent claims, even if that feature or combination itself is not explicitly stated in the patent claims or the exemplary embodiments.

LIST OF REFERENCE SIGNS 11 first contact point
12 second contact point
20 protective diode
21 first diode structure
22 second diode structure
31 first connection point
32 second connection point
4 base body
5 semiconductor chip
71 first overlap region
72 second overlap region
73 third overlap region
S section line

The invention claimed is:

1. An electronic component, comprising:
a first contact point for n-side contacting,
a second contact point for p-side contacting,
a base body, and
a protective diode, which is connected antiparallel to the first contact point and to the second contact point, wherein
the protective diode comprises a first diode structure which is p-conductive,
the protective diode comprises a second diode structure which is n-conductive,
the first diode structure is formed as a layer which overlaps in places with the first contact point in a first overlap region,
the second diode structure is formed as a layer which overlaps in places with the second contact point in a second overlap region,
the first diode structure and the second diode structure overlap each other in a third overlap region, and
the first diode structure and the second diode structure are arranged on an outer surface of the base body and are in direct contact with the base body.

2. The electronic component according to claim 1, wherein the first diode structure has a thickness of less than or equal to 1 μm and the second diode structure has a thickness of less than or equal to 1 μm.

3. The electronic component according to claim 1, wherein the first diode structure and the second diode structure, each have the same base material, and wherein the base material is polycrystalline or amorphous.

4. The electronic component according to claim 1, wherein the first diode structure and/or the second diode structure is produced by sputtering.

5. The electronic component according to claim 1, wherein the first diode structure and/or the second diode structure is produced by vapor deposition and subsequent tempering.

6. The electronic component according to claim 1, wherein the protective diode is generated at the first contact point and the second contact point.

7. The electronic component according to claim 1, wherein the first diode structure and the second diode structure, each have the same base material, and wherein the base material comprises at least one of the following materials: semiconductor material, silicon, ZnO, ITO, and IZO.

8. The electronic component according to claim 1, further comprising an optoelectronic semiconductor chip configured to generate or receive electromagnetic radiation, wherein the protective diode is permeable to an electromagnetic radiation.

9. The electronic component according to claim 1, wherein
the first contact point and the first diode structure are in direct contact with one another in the first overlap region,
the second contact point and the second diode structure are in direct contact with one another in the second overlap region, and
the first diode structure and the second diode structure are in direct contact with one another in the third overlap region.

10. The electronic component according to claim 1, wherein
the first overlap region has an area of at least 100 μm$^2$,
the second overlap region has an area of at least 100 μm$^2$, and
the third overlap region has an area of at least 100 μm$^2$.

11. The electronic component according to claim 1, further comprising a first connection point in direct contact with the first contact point and the first diode structure, wherein the first diode structure is arranged in places between the first connection point and the first contact point.

12. The electronic component according to claim 11, wherein the first connection point is galvanically generated on the first contact point and the first diode structure.

13. The electronic component according to claim 11, further comprising a second connection point in direct contact with the second contact point and the second diode structure, wherein the second diode structure is disposed in places between the second connection point and the second contact point.

14. The electronic component according to claim 13, wherein the second connection point is galvanically generated on the second contact point and the second diode structure.

15. The electronic component according to claim 1, wherein the base body comprises at least one of the following materials or elements: metal, semiconductor, plastic, ceramic, and a semiconductor chip.

\* \* \* \* \*